(12) United States Patent  (10) Patent No.: US 7,674,989 B2
Kikuchi et al.  (45) Date of Patent: Mar. 9, 2010

(54) WIRING BOARD AND METHOD FOR MANUFACTURING THE SAME

(75) Inventors: Katsumi Kikuchi, Tokyo (JP); Shintaro Yamamichi, Tokyo (JP); Hideya Murai, Tokyo (JP); Takuo Funaya, Tokyo (JP); Takehiko Maeda, Kanagawa (JP); Hirokazu Honda, Kanagawa (JP); Kenta Ogawa, Kanagawa (JP); Jun Tsukano, Kanagawa (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 32 days.

(21) Appl. No.: 11/449,673

(22) Filed: Jun. 9, 2006

(65) Prior Publication Data

US 2006/0283629 A1    Dec. 21, 2006

(30) Foreign Application Priority Data

Jun. 17, 2005    (JP) .............................. 2005-178452

(51) Int. Cl.
   *H01R 12/04*    (2006.01)
(52) U.S. Cl. .................. 174/262; 174/260; 174/261; 174/263; 174/264; 174/265; 174/266
(58) Field of Classification Search ............. 361/262; 174/260–266
   See application file for complete search history.

(56) References Cited

U.S. PATENT DOCUMENTS

| 5,343,366 | A  | * | 8/1994  | Cipolla et al. ............... 361/785 |
| 6,136,717 | A  | * | 10/2000 | Winnerl et al. .............. 438/705 |
| 6,353,540 | B1 | * | 3/2002  | Akiba et al. ................ 361/794 |
| 6,388,204 | B1 | * | 5/2002  | Lauffer et al. .............. 174/261 |
| 6,713,685 | B1 | * | 3/2004  | Cotton ....................... 174/262 |
| 6,768,189 | B1 | * | 7/2004  | Anderson et al. ........... 257/678 |
| 6,834,427 | B2 | * | 12/2004 | Cornelius et al. ............ 29/840 |
| 7,342,470 | B2 | * | 3/2008  | Bassali ....................... 333/219 |
| 7,427,718 | B2 | * | 9/2008  | Ng et al. ..................... 174/255 |
| 2002/0093804 | A1 | * | 7/2002  | Schoenborn ................ 361/780 |
| 2002/0170742 | A1 | * | 11/2002 | Liaw et al. .................. 174/250 |
| 2003/0099097 | A1 | * | 5/2003  | Mok et al. ................... 361/767 |
| 2003/0209796 | A1 | * | 11/2003 | Kondo et al. ................ 257/690 |
| 2003/0218871 | A1 | * | 11/2003 | Suwa et al. ................. 361/795 |
| 2004/0184219 | A1 | * | 9/2004  | Otsuka et al. ............ 361/306.3 |

(Continued)

FOREIGN PATENT DOCUMENTS

JP    8-306820 A    11/1996

(Continued)

*Primary Examiner*—Jinhee J Lee
*Assistant Examiner*—Hoa C Nguyen
(74) *Attorney, Agent, or Firm*—Sughrue Mion, PLLC (57) ABSTRACT

A wiring board for mounting a semiconductor element or electronic component having a plurality of wiring layers, an insulating layer provided between these wiring layers, and a via which is provided to the insulating layer and which electrically connects the wiring layers. In this wiring board, the cross-sectional shape of the via in the plane parallel to the wiring layers is obtained by the partial overlapping of a plurality of similar shapes (circles). Stable operation can be obtained in a semiconductor element by minimizing obstacles to increased density, effectively increasing the cross-sectional area of the via, and preventing the wiring resistance from increasing by making the cross-sectional shape of the via into a shape obtained by the partial overlapping of a plurality of similar shapes.

23 Claims, 6 Drawing Sheets

U.S. PATENT DOCUMENTS

| | | | |
|---|---|---|---|
| 2004/0223309 A1* | 11/2004 | Haemer et al. | 361/767 |
| 2005/0039948 A1* | 2/2005 | Asai et al. | 174/262 |
| 2005/0252683 A1* | 11/2005 | Hsu | 174/262 |
| 2006/0072298 A1* | 4/2006 | Ng et al. | 361/818 |
| 2006/0283629 A1* | 12/2006 | Kikuchi et al. | 174/262 |
| 2008/0164057 A1* | 7/2008 | Mori et al. | 174/262 |

FOREIGN PATENT DOCUMENTS

| | | |
|---|---|---|
| JP | 8-330474 A | 12/1996 |
| JP | 2679681 B2 | 8/1997 |
| JP | 11-017058 A | 1/1999 |
| JP | 2000-58701 A | 2/2000 |

* cited by examiner

WIRING BOARD AND METHOD FOR MANUFACTURING THE SAME

BACKGROUND OF THE INVENTION

1. Field of the Invention

The present invention relates to a wiring board for mounting a semiconductor element, and to a method for manufacturing the same. The present invention particularly relates to a wiring board in which the connection via structure of the power source and ground is improved, and to a method for manufacturing the same.

2. Description of the Related Art

Examples of the heretofore used wiring boards for mounting a semiconductor element include ceramic wiring boards such as the one disclosed in Japanese Laid-open Patent Application No. 8-330474 that uses alumina or another insulating material; build-up substrates such as those disclosed in Japanese Laid-open Patent Application No. 11-17058 and Japanese Patent No. 2679681, in which an organic resin is used as the insulating material, and a micro-circuit is formed by forming copper wiring using an etching method and a plating method; and the tape-type substrate disclosed in Japanese Laid-open Patent Application No. 2000-58701, in which copper wiring is formed in a polyimide-based film or other film.

Recently developed boards for mounting a semiconductor element generally employ a build-up substrate that can be adapted to narrow-pitch connections. However, increased density is particularly sought in electronic devices such as mobile telephones. This demand results from rapid progress in miniaturization, thickness reduction, and increased density, as well as the increase in the number of terminals that accompanies increased speed and functionality of semiconductor elements.

Particularly in build-up substrates for mounting semiconductor elements, it has become possible to stably provide a minute pattern having a wiring pattern width of 25 µm and a via diameter of about 70 µm. However, the circuit dimensions that a build-up substrate must accommodate are increasing due to increases in performance and functionality of semiconductor elements. It is therefore not uncommon for the layer count to reach ten or more even when micro-wiring and an extremely small via diameter is used.

Diminished electrical characteristics due to increased wiring resistance have become a problem in this type of multilayer board that uses micro-wiring and an extremely small via diameter. Specifically, increased wiring resistance creates a situation in which the power source voltage supplied is insufficient for operating the semiconductor element, and the system fails to operate. A method for providing a plurality of vias having the same shape is employed as a measure for overcoming this problem, but this method has problems in that the surface area used exclusively by the vias and the conductor connected to the vias increases, making it more difficult to increase the density.

SUMMARY OF THE INVENTION

An object of the present invention is to provide a wiring board that is capable of enabling the stable operation of a semiconductor element by minimizing obstacles to increased density by giving the cross-sectional shape of the via a shape in which portions of a plurality of similar shapes overlap, effectively increasing the cross-sectional area of the via, and preventing the wiring resistance from increasing, and to provide a method for manufacturing the same.

According to a first aspect of the present invention, there is provided a wiring board for mounting a semiconductor element or an electronic component, the wiring board comprising a plurality of wiring layers, one or a plurality of insulating layers provided between said wiring layers, and vias provided to said insulating layer and electrically connect the upper and lower wiring layers of said insulating layer which is provided with said vias, wherein at least one of said vias is designed so that the cross-sectional shape of the via in the plane parallel to said wiring layers is obtained by the partial overlapping of a plurality of similar shapes.

According to the present invention, the cross-sectional area can be efficiently increased by giving the via a shape in which portions of a plurality of similar shapes overlap, and aligning the longitudinal axis with the direction in which there is excess surface area according to the manner in which the wiring is routed.

According to the present invention, all of said vias may be designed so that the cross-sectional shape of the vias in the plane parallel to said wiring layers is obtained by the partial overlapping of a plurality of similar shapes.

In an example of the wiring board according to the present invention, the wiring board has power wiring, and a via whose cross-sectional shape in the plane parallel to the wiring layers is obtained by the partial overlapping of a plurality of similar shapes is electrically connected to the power wiring.

According to the present invention, the wiring resistance of the power wiring can be reduced, and the electrical characteristics thereof can be enhanced. The power supply can therefore be stabilized, and stable operation of the semiconductor element can be realized.

In an example of the wiring board according to the present invention, the wiring board has ground wiring; and a via whose cross-sectional shape in the plane parallel to the wiring layers is obtained by the partial overlapping of a plurality of similar shapes is electrically connected to the ground wiring.

According to the present invention, the wiring resistance can be reduced in the ground wiring that has the same function as the power system, and the electrical characteristics thereof are enhanced. Therefore, stable operation of the semiconductor element can be realized.

In an example of the wiring board according to the present invention, the wiring board has both power wiring and ground wiring; vias that are electrically connected to the power wiring are designed so that the cross-sectional shape of the vias in the plane parallel to the wiring layers is obtained by the partial overlapping of a plurality of similar shapes; and vias that are electrically connected to the ground wiring are designed so that the cross-sectional shape of the vias in the plane parallel to the wiring layers is obtained by the partial overlapping of a plurality of similar shapes.

According to the present invention, the wiring resistance of the circuits of the power system and ground system can be reduced, and the electrical characteristics can be enhanced. Therefore, stable operation of the semiconductor element can be realized.

In an example of the wiring board according to the present invention, the wiring board has signal wiring; and a via whose cross-sectional shape in the plane parallel to the wiring layers is obtained by the partial overlapping of a plurality of similar shapes is electrically connected to the signal wiring.

According to the present invention, the wiring resistance of the signal wiring can be reduced, and degradation of the signal characteristics can be suppressed for a circuit in which low resistance is required because of considerations related to signal characteristics.

In an example of the wiring board according to the present invention, the wiring board has a via end that is disposed further outside than the via end closest to the center point of the next adjacent end shape in the via shape.

In an example of the wiring board according to the present invention, the similar shapes are round.

In an example of the wiring board according to the present invention, each of the vias comprises a via hole provided to the insulating layer; and a conductor which is provided inside the via hole and which electrically connects the wiring layers provided so as to sandwich the insulating layer.

In an example of the wiring board according to the present invention, the primary material constituting the conductor is at least one type of material selected from the group consisting of copper, aluminum, gold, silver, nickel, a soldering material, and a conductive paste.

In an example of the wiring board according to the present invention, the conductor inside the via hole is formed so as to cover the inner wall of the via hole, or is formed so as to fill the inside of the via hole.

According to a second aspect of the present invention, there is provided a method for manufacturing a wiring board for mounting a semiconductor element or an electronic component comprising a plurality of wiring layers, one or a plurality of insulating layers provided between said wiring layers, and a plurality of vias provided to said insulating layer and electrically connect the upper and lower wiring layers of said insulating layer, the method for manufacturing a wiring board comprising the steps of forming an insulating layer with a plurality of via holes, cross-sectional shape in the plane parallel to said wiring layers of at least one of said via holes being obtained by the partial overlapping of a plurality of similar shapes, and forming a conductor inside each of said via hole to form a via through which the upper and lower wiring layers of said insulating layer are electrically connected to each other.

According to the present invention, all of said via holes provided at said insulating layer have the cross-sectional shape in the plane parallel to said wiring layers, the cross-sectional shape being obtained by the partial overlapping of a plurality of similar shapes.

In an example of the method for manufacturing a wiring board according to the present invention, the conductor is formed inside each of the via holes in a step in which the wiring layers are formed after the via holes of the insulating layer are formed.

In an example of the method for manufacturing a wiring board according to the present invention, the similar shapes are formed so as to be round.

In an example of the method for manufacturing a wiring board according to the present invention, the primary material constituting the conductor is at least one type of material selected from the group consisting of copper, aluminum, gold, silver, nickel, and a soldering material.

In an example of the method for manufacturing a wiring board according to the present invention, the conductor is formed from at least one type of material selected from the group consisting of an electroless plating metal, an electroplating metal, a conductive paste, a soldering material, and a low-melting metal.

In an example of the method for manufacturing a wiring board according to the present invention, the conductor inside each of the via holes is formed so as to cover the wall surface of the via hole, or is formed so as to fill the inside of the via hole.

The cross-sectional area based on the via diameter can easily be increased in the present invention by adopting a shape obtained by the partial overlapping of a plurality of similar shapes as the cross-sectional shape of the vias in the plane parallel to the wiring layers. With laser machining in particular, the same shapes can be machined, but forming different shapes only in specific positions is difficult to accomplish. Therefore, specialized machining is dispensed with by creating a shape from partially overlapping similar or identical shapes, and machining can easily be performed with no change in manufacturing cost or output.

By partially placing the longitudinal axis in the direction in which there is excess area when the wiring is routed, adverse effects that cause reduced wiring density can be minimized, and the cross-sectional area of the vias can be effectively increased.

Resistance in the vias can be minimized by increasing the cross-sectional area of the vias. Using such vias in a power circuit or a ground circuit makes it possible to supply an adequate power supply voltage, and stable operation of a semiconductor element can be achieved. This approach can also be used in part in signal wiring in which the wiring resistance is strictly regulated, whereby deterioration of the characteristics of the semiconductor element can be reduced.

DESCRIPTION OF THE PREFERRED EMBODIMENTS

Figure 1A:
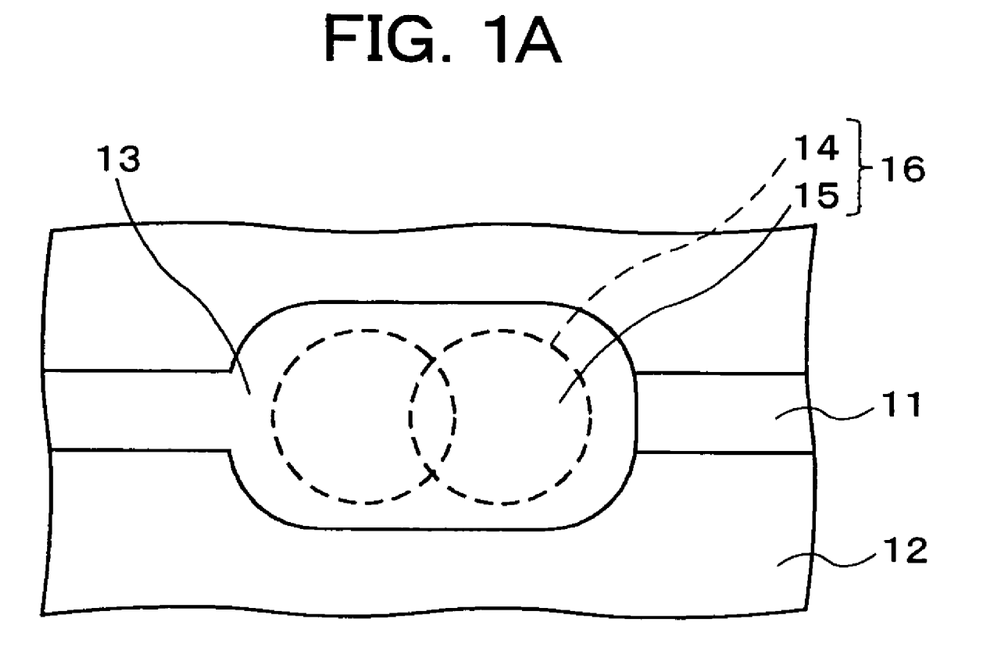
FIG. 1A is a plan view showing an example of the structure of the wiring board according to a first embodiment of the present invention.
Figure 1B:
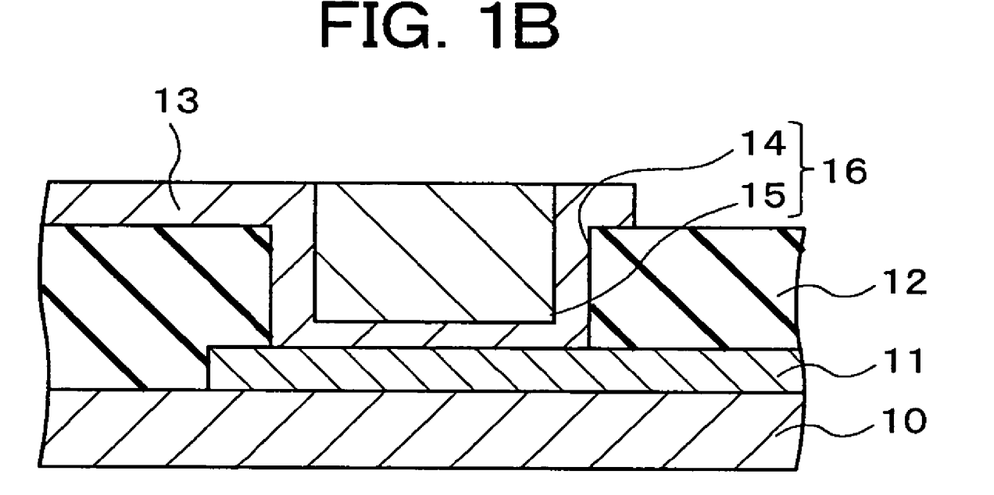
FIG. 1B is a sectional view of the same.

Embodiments of the present invention will be described in detail hereinafter with reference to the accompanying drawings. The wiring board according to a first embodiment of the present invention will first be described. FIG. 1A is a plan view showing a portion of the wiring board of the present embodiment, and FIG. 1B is a sectional view of the same. In the wiring board shown in FIG. 1, a first wiring layer 11 is provided on a foundation (carrier) board 10, an insulating layer 12 is provided on the first wiring layer 11, and a second wiring layer 13 is furthermore formed on the insulating layer 12. The first wiring layer 11 and the second wiring layer 13 are connected to each other by a via 16 composed of a via hole 14 provided inside the insulating layer 12 and a conductor 15 embedded in the via hole 14.

The carrier board 10 is composed of a material whereby the surface that is in contact with the bottom face of the first wiring layer 11 has insulating properties. A printed board or a board that is composed of a ceramic, a metal, a resin material, silicon, GaAs, sapphire, or the like, and is a rigid material that enables wiring to be formed on the surface thereof may be used as the carrier board 10 insofar as the surface thereof has insulating properties. Furthermore, a board that is already provided with a circuit and composed of a single layer or multiple layers may be used as the carrier board 10. A printed board is used as the carrier board 10 in the present embodiment.

The first wiring layer 11 is provided on the carrier board 10. In cases in which, a circuit is provided to the carrier board 10, the first wiring layer 11 may be electrically connected to this circuit. The primary component of the first wiring layer 11 is one or more types of metal selected from the group consisting of copper, gold, nickel, aluminum, silver, and palladium, but copper is most preferred for its low resistance and comparatively low cost.

The first wiring layer 11 is formed as described above from copper, for example, and has a thickness of 15 μm, for example. The first wiring layer 11 is formed, for example, by a subtractive method, a semi-additive method, a full additive method, or another method. The subtractive method is a method for obtaining the desired pattern by forming a resist in the desired pattern on a copper foil provided on a board, etching the excess foil, and then peeling off the resist. The semi-additive method is a method for obtaining the desired wiring pattern by forming a power supply layer by electroless plating, sputtering, CVD (Chemical Vapor Deposition), or another method, then forming a resist having the desired pattern, depositing metal in the open portion of the resist by an electroplating method, removing the resist, and etching the power supply layer. The full additive method is a method for obtaining the desired wiring pattern by causing an electroless plating catalyst to be adsorbed onto a board, then forming a pattern in a resist, activating the catalyst with the resist still remaining as an insulating film, and depositing metal in the open portion of the insulating film by an electroless plating method. A method may also be used in which a concave portion as the wiring pattern is formed in advance in the insulating layer (not shown in the drawing) to which the first wiring layer 11 is provided, and a power supply layer is formed by electroless plating, sputtering, CVD, or another method, after which the concave portion is filled with plating metal by electroless plating or electroplating, and the surface is prepared by polishing.

The insulating layer 12 is formed from an organic material or an inorganic material that is photosensitive or non-photosensitive, for example. Examples of organic materials that may be used include epoxy resin, epoxy acrylate resin, urethane acrylate resin, polyester resin, phenol resin, polyimide resin, BCB (benzocyclobutene), PBO (polybenzoxazole), polynorbornene resin, and the like; and glass cloth or woven cloth formed from aramid fibers or the like, or nonwoven cloth impregnated with epoxy resin, epoxy acrylate resin, urethane acrylate resin, polyester resin, phenol resin, polyimide resin, BCB, PBO (polybenzoxazole), polynorbornene resin, or the like. Polyimide resin, PBO, and materials that use a woven cloth or nonwoven cloth have excellent film strength, tensile strength, elongation at break, and other mechanical characteristics, and can therefore produce a high degree of reliability. Examples of inorganic materials that can be used include silicon oxide, silicon nitride, silicon oxynitride, silicon carbide, low-k (low dielectric constant) materials, alumina, aluminum nitride, glass ceramics, and other materials.

The via 16 is composed of a via hole 14 provided in the insulating layer 12 and an internally disposed conductor 15. The cross-sectional shape of the via 16 in the plane parallel to the first wiring layer 11 or the second wiring layer 13 is obtained by the partial overlapping of a plurality of similar shapes. The cross-sectional shape of the via 16 always has an end that is located further outside than the end closest to the center point of the next adjacent end shape. Adopting this shape causes the direction of the longitudinal edge to conform to the shape in which the wiring is routed, whereby the cross-sectional area of the via 16 can be effectively increased without hindering increased density. A round shape or a polygonal shape may also be used as the similar shape used in the via 16. Examples of this polygonal shape include an octagon, a hexagon, a quadrilateral, a rhombus, a trapezoid, a triangle, or the like. The polygon may also have curved apexes. However, a round shape is particularly suitable as the similar shape in the via 16.

When a photosensitive material is used, the via hole 14 is formed by photolithography in accordance with the cross-sectional shape of the via 16. When a non-photosensitive material or a photosensitive material having a low pattern resolution is used, the via hole 14 is formed by laser machining, dry etching, or blasting. Since such via holes 14 are formed one at a time by laser machining, the cross-sectional shape of the via 16 of the present invention can be obtained by performing laser machining so that some of the holes overlap. When the via 16 is formed by a process in which a plated post is formed in advance in the position of the via 16, after which an insulating film is formed, the surface of the insulating film is ground down by polishing, and the plated post is exposed, there is no need to provide the via hole 14 in advance to the insulating layer 12.

Figure 3A:
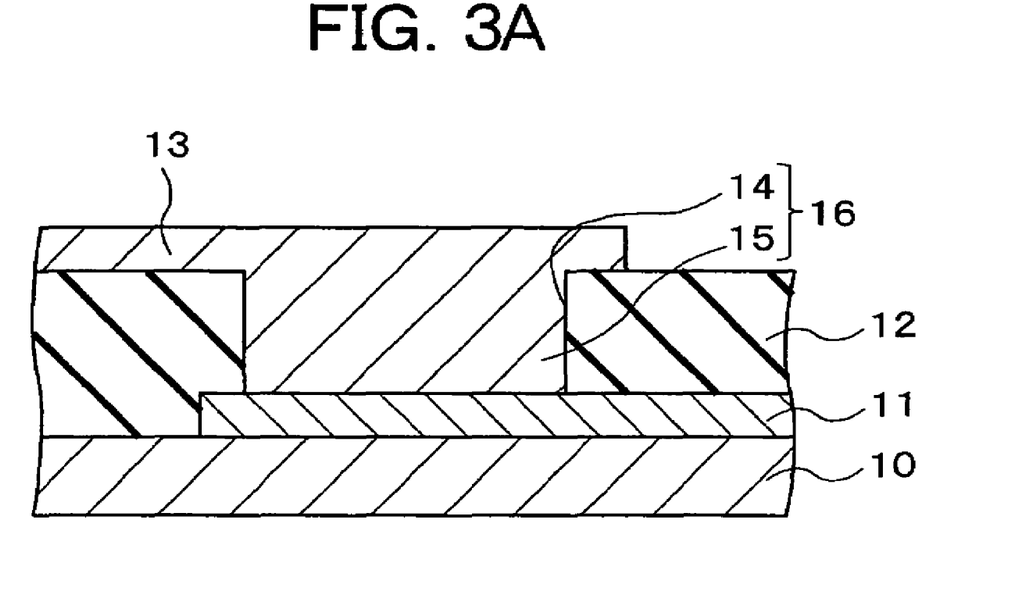
FIGS. 3A and 3B are sectional views showing examples of the via structure of the wiring board according to the first embodiment of the present invention.
Figure 3B:
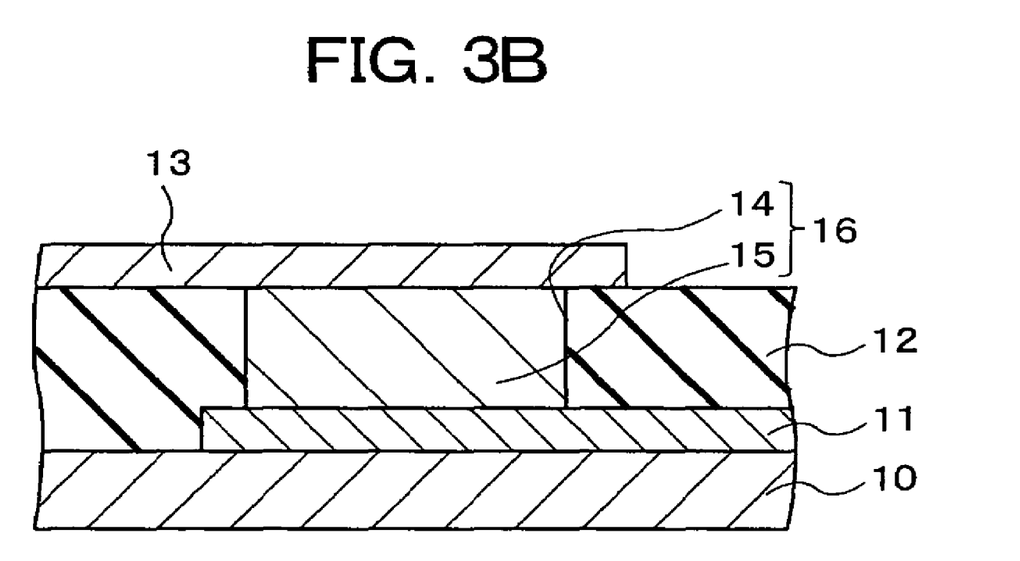

The conductor 15 is electrically connected to the first wiring layer 11 and the second wiring layer 13. The primary material constituting the conductor 15 is composed of at least one type of material selected from the group consisting of copper, aluminum, gold, silver, nickel, a soldering material, and a conductive paste. The conductor 15 is preferably formed from either copper or a soldering material, or a combination thereof, because of the low resistance and low cost of these materials in particular. The conductor 15 may be formed along the inner wall of the via hole 14 so as to cover this inner surface, as shown in FIG. 3A, or may be formed so as to fill the inside of the via hole 14, as shown in FIG. 3B. The conductor 15 may also be formed at the same time as the second wiring layer 13.

As previously mentioned, the second wiring layer 13 is formed from copper, for example, and has a thickness of 15 μm, for example. The second wiring layer 13 may be formed, for example, by a subtractive method, a semi-additive method, a full additive method, or another method. The subtractive method is a method for obtaining the desired pattern by forming a resist in the desired pattern on a copper foil provided on a board, etching the excess foil, and then peeling off the resist. The semi-additive method is a method for obtaining the desired wiring pattern by forming a power supply layer by electroless plating, sputtering, CVD, or another method, then forming a resist having the desired pattern, depositing metal in the open portion of the resist by an electroplating method, removing the resist, and etching the power supply layer. The full additive method is a method for obtaining the desired wiring pattern by causing an electroless plating catalyst to be adsorbed onto a board, then forming a pattern in a resist, activating the catalyst with the resist still remaining as an insulating film, and depositing metal in the open portion of the insulating film by electroless plating. A method may also be used in which a concave portion as the wiring pattern is provided to the insulating layer 12 separately from the via hole 14, a power supply layer is formed by electroless plating, sputtering, CVD, or another method, after which the concave portion is filled by electroless plating or electroplating, and the surface is prepared by polishing.

In the present embodiment, a material in which an aramid nonwoven cloth is impregnated with an epoxy resin is used as the insulating layer 12, the via 16 is provided with a via hole 14 by a laser method, and the first wiring layer 11 and second wiring layer 13 are formed by a semi-additive method based on electrolytic copper plating in which an electroless copper coating is used as the power supply layer. The conductor 15 is also formed at the same time as the second wiring layer 13.

This type of wiring board circuit has power wiring, ground wiring, and signal wiring, and the structure of the via 16 of the present invention is provided as needed to all or part of the wiring board. Providing the via of the present invention to the power wiring or ground wiring reduces the wiring resistance of the circuit and improves the power supply voltage drop (IR-Drop), thereby enabling stable operation of the semiconductor element. Furthermore, since the wiring resistance is strictly regulated according to the type of signal in the signal wiring, the via 16 of the present invention becomes necessary.

The embodiment shown in FIG. 1 is a two-layer wiring structure that includes the first wiring layer 11, the second wiring layer 13, and the insulating layer 12, but the present invention is not limited by this configuration, and may also be applied in a wiring structure in which there are three or more wiring layers and two or more insulating layers.

Figure 2A:
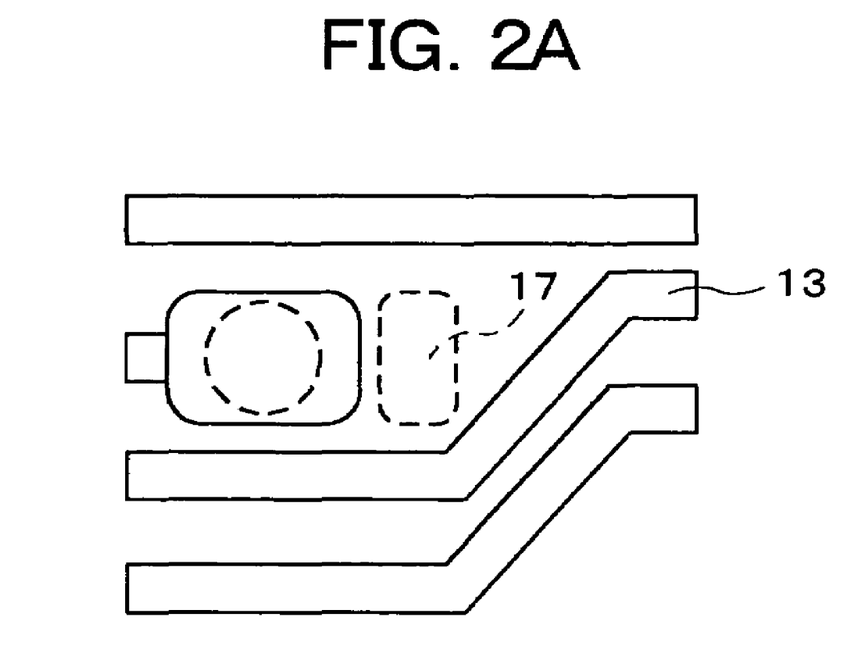
FIG. 2A is a plan view showing the conventional wiring routing structure.
Figure 2B:
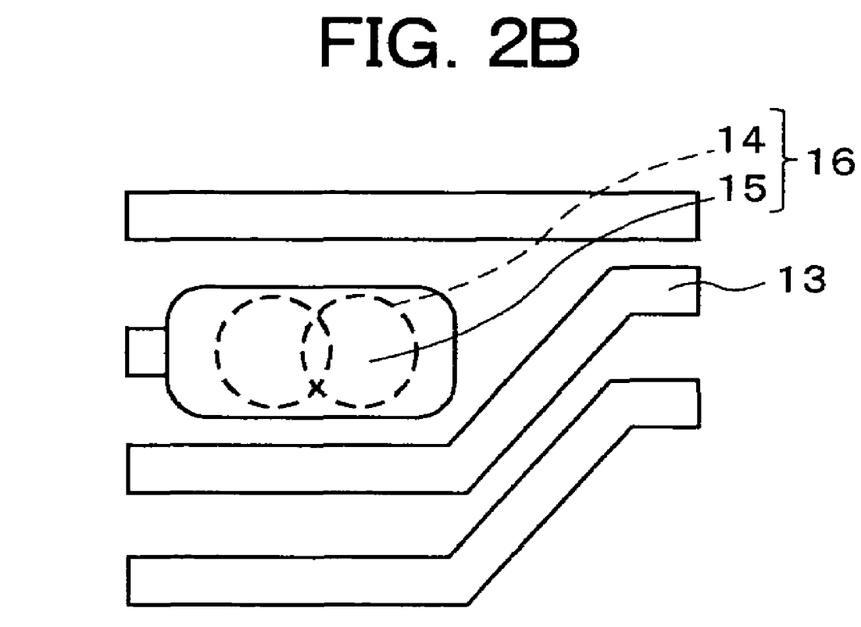
FIG. 2B is a plan view showing the wiring routing structure of the wiring board according to the first embodiment of the present invention.

As shown in FIG. 2, according to the manner in which the wiring is routed, a dead space 17 often occurs that is an area in which a via can only be formed having a single shape by the conventional method shown in FIG. 2A, and which cannot be used for routing. However, varying the amount of overlap in the via 16 of the present invention shown in FIG. 2B makes it possible to position the via so that there is no dead space, and the cross-sectional area of the via can be effectively increased. Lower resistance can thereby be obtained in the wiring while minimizing adverse effects on high-density wiring.

According to the present invention, the cross-sectional area of the bottom of the via can be effectively increased, and wiring resistance can be reduced while minimizing adverse effects on the wiring density. Stable operation of the semiconductor element can therefore be achieved.

Figure 4A:
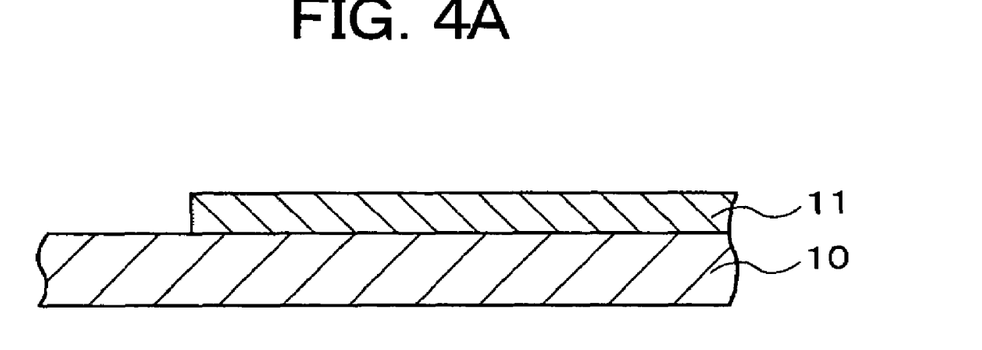
FIGS. 4A to 4C are sectional views showing the sequence of steps in the method for manufacturing a wiring board according to an embodiment of the present invention.
Figure 4B:
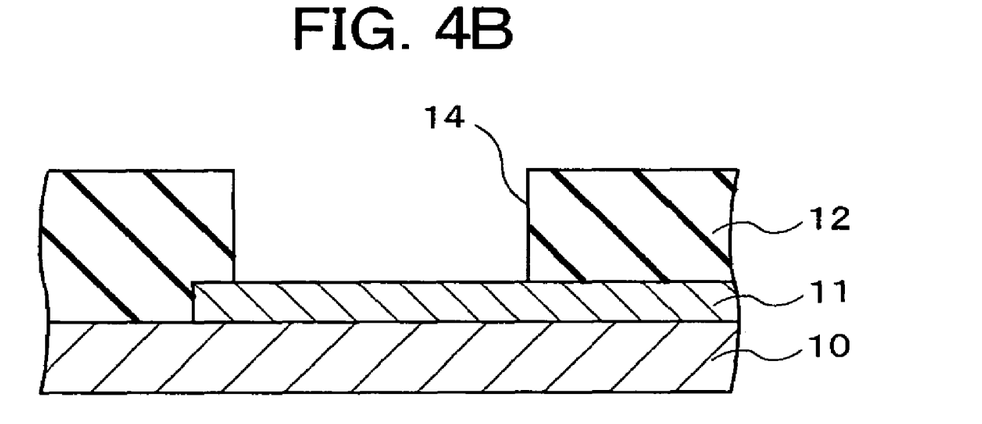
Figure 4C:
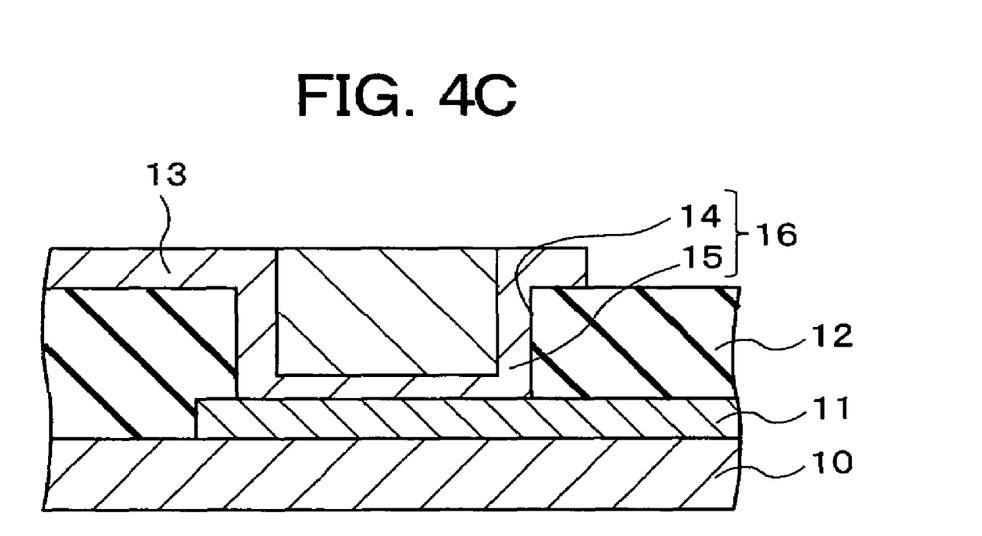

The method for manufacturing the wiring board according to an embodiment of the present invention will next be described. FIGS. 4A through 4C are sectional views showing the sequence of steps in the method for manufacturing a wiring board according to this embodiment of the present invention. Although not specifically mentioned herein, appropriate rinsing and heat treatment are also performed as needed.

As shown in FIG. 4A, a first wiring layer 11 is formed on a carrier board 10. The primary component of this first wiring layer 11 is formed from at least one type of material selected from the group consisting of copper, gold, nickel, aluminum, silver, and palladium, and may be formed, for example, by a subtractive method, a semi-additive method, a full additive method, or another method. The subtractive method is a method for obtaining the desired pattern by forming a resist in the desired pattern on a copper foil provided on a board, etching the excess foil, and then peeling off the resist. The semi-additive method is a method for obtaining the desired wiring pattern by forming a power supply layer by electroless plating, sputtering, CVD, or another method, then forming a resist having the desired pattern, depositing metal in the open portion of the resist by an electroplating method, removing the resist, and etching the power supply layer. The full additive method is a method for obtaining the desired wiring pattern by causing an electroless plating catalyst to be adsorbed onto a board, then forming a pattern in a resist, activating the catalyst with the resist still remaining as an insulating film, and depositing metal in the open portion of the insulating film by electroless plating. A method may also be used in which a concave portion is shaped as the wiring pattern in an insulating layer (not shown in the drawing) to which the first wiring layer 11 is provided, a power supply layer is formed by electroless plating, sputtering, CVD, or another method, after which the concave portion is filled by electroless plating or electroplating, and the surface is prepared by polishing.

Figure 5A:
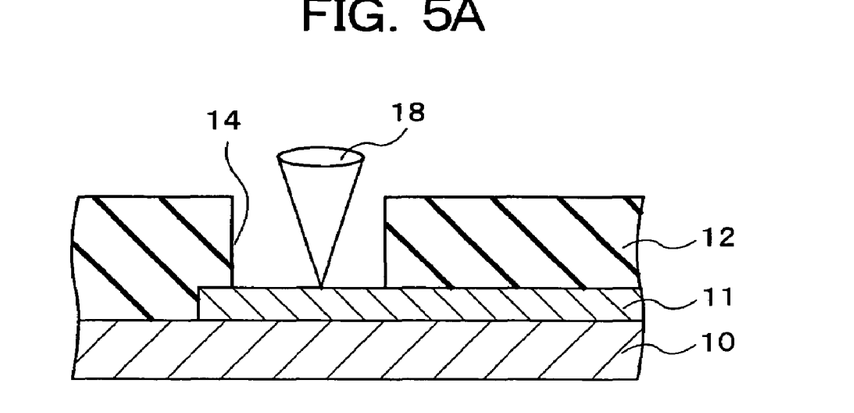
FIGS. 5A and 5B are sectional views showing the sequence of steps for an example of the via hole formation method in the method for manufacturing a wiring board according to an embodiment of the present invention.
Figure 5B:
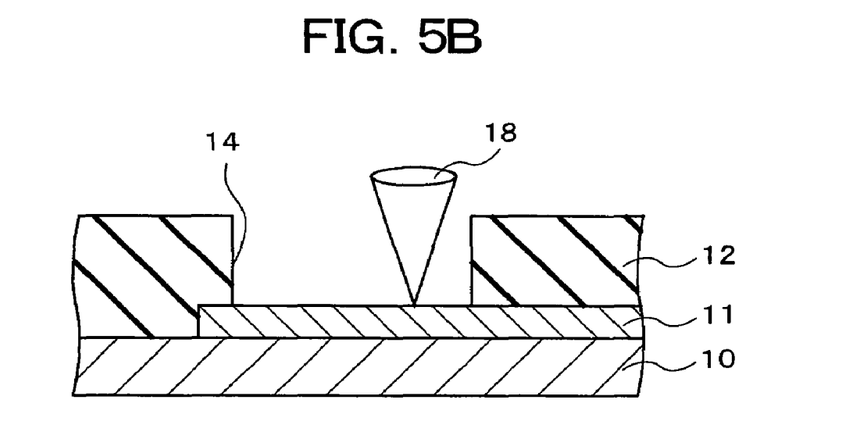

Then, as shown in FIG. 4B, the insulating layer 12 is layered on the first wiring layer 11, and a via hole 14 is formed so that the first wiring layer 11 is exposed. When the material used for the insulating layer 12 is a liquid, the insulating layer 12 may be formed using a spin coater, a die coater, a curtain coater, a pulling method, a printing method, or the like. When the insulating layer 12 is a sheet, the insulating layer 12 may be formed using a hot press, a vacuum press, a heated vacuum press, a laminator, a vacuum laminator, or the like. When the insulating layer 12 is composed of an inorganic material, the insulating layer 12 may be formed by sputtering, CVD, or the like. The via hole 14 may be formed by photolithography so as to conform to the cross-sectional shape of the via 16 when a photosensitive material is used. When a non-photosensitive material or a photosensitive material having a low pattern resolution is used, the via hole 14 may be formed by laser machining, dry etching, or blasting. Since such via holes 14 are formed one at a time by laser machining, the cross-sectional shape of the via 16 of the present invention can be obtained by changing the position of the laser 18 and performing laser machining so that some of the laser-machined regions overlap, as shown in FIGS. 5A and 5B. When the via 16 is formed by a process in which a plated post is formed in advance in the position of the via 16, after which an insulating film is formed, the surface of the insulating film is ground down by polishing, and the plated post is exposed, there is no need to provide the via hole 14 in advance to the insulating layer 12.

A second wiring layer 13 is then formed on the insulating layer 12, as shown in FIG. 4C. In the present embodiment, the conductor 15 inside the via hole 14 is formed at the same time as the second wiring layer 13. The second wiring layer 13 may be formed, for example, by a subtractive method, a semi-additive method, a full additive method, or another method. The subtractive method is a method for obtaining the desired pattern by forming a resist in the desired pattern on a copper foil provided on a board, etching the excess foil, and then peeling off the resist. The semi-additive method is a method for obtaining the desired wiring pattern by forming a power supply layer by electroless plating, sputtering, CVD, or another method, then forming a resist having the desired pattern, depositing metal in the open portion of the resist by an electroplating method, removing the resist, and etching the power supply layer. The full additive method is a method for obtaining the desired wiring pattern by causing an electroless plating catalyst to be adsorbed onto a board, then forming a pattern in a resist, activating the catalyst with the resist still remaining as an insulating film, and depositing metal in the open portion of the insulating film by an electroless plating method. A method may also be used in which a concave portion as the wiring pattern is provided to the insulating layer 12 separately from the via hole 14, a power supply layer is formed by electroless plating, sputtering, CVD, or another method, the concave portion is then filled by electroless plating or electroplating, and the surface is prepared by polishing.

The structure of the wiring board of the first embodiment of the present invention shown in FIG. 1 can be efficiently obtained by the wiring board manufacturing method according to the embodiment of the present invention described above.

Figure 6:
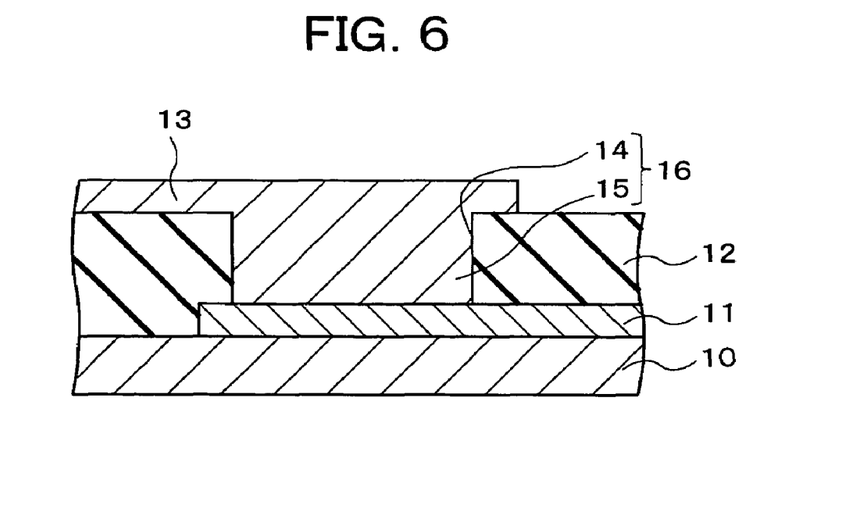
FIG. 6 is a sectional view showing the via hole formation method in a first modification of the method for manufacturing a wiring board according to an embodiment of the present invention.

A first modification of the wiring board of the first embodiment of the present invention will next be described with reference to FIG. 6. FIG. 6 shows the step for forming the second wiring layer 13, wherein the via hole 14 is filled with the conductor 15 following the step shown in FIG. 4B. By using a plating solution that readily fills the concave portion as the plating solution used in the electroplating process for the second wiring layer 13, the inside of the via hole 14 can be filled with the conductor.

In this first modification, since the via 16 is filled in, the danger of air bubbles becoming trapped in the concave portion as shown in FIG. 4C can be avoided, and the reliability of the micro-via is enhanced. It also becomes possible to form a separate via at the top of the via 16.

Figure 7A:
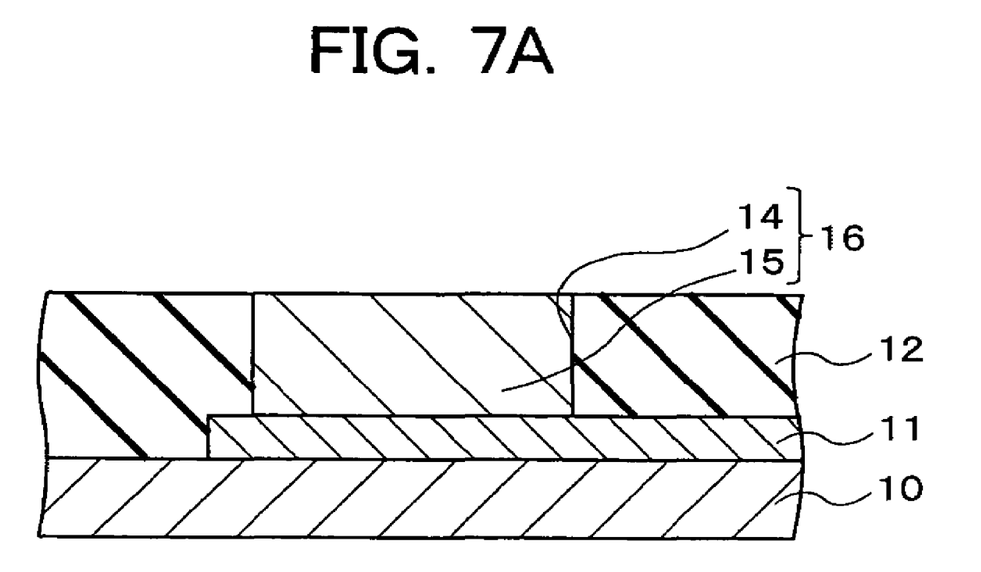
FIGS. 7A and 7B are sectional views showing the sequence of steps in the via hole formation method in a second modification of the method for manufacturing a wiring board according to an embodiment of the present invention.
Figure 7B:
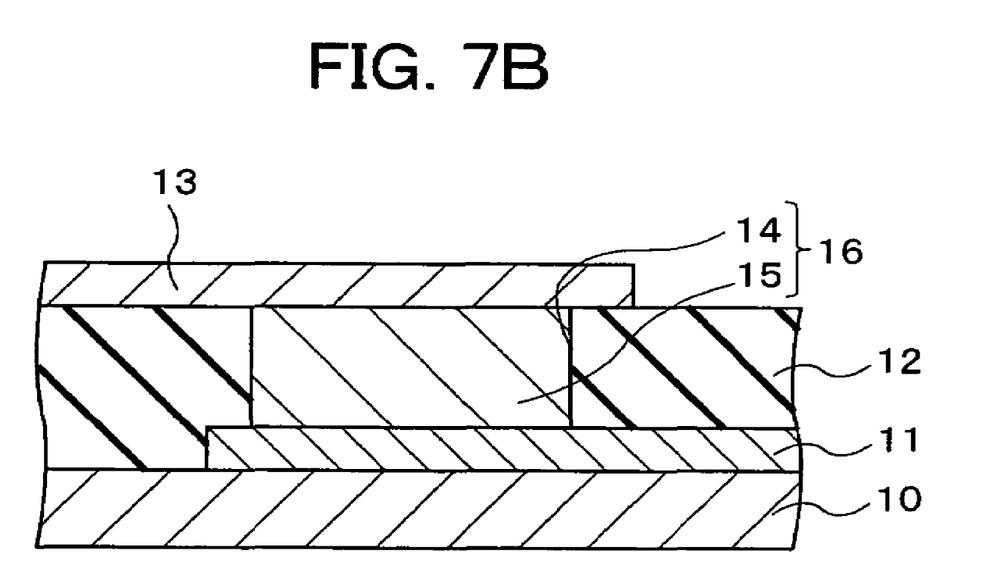

A second modification of the wiring board of the first embodiment of the present invention will next be described. FIGS. 7A and 7B show the step for forming the conductor 15 and second wiring layer 13, wherein the via hole 14 is filled with the conductor 15 following the step shown in FIG. 4B.

As shown in FIG. 7A, the via hole 14 formed in FIG. 4B is filled with the conductor 15. When the filled material is a soldering material or a conductive paste, the conductor 15 can be formed by screen printing, injection, or the like. When the via hole 14 is formed by a laser method, a method may be used whereby a protective film is provided in advance to the surface of the insulating layer 12, the via hole 14 is formed at the same time by laser machining, a soldering material or a conductive paste is printed on the protective film without a printing mask, and the protective film is finally removed. The conductor 15 may also be formed by electroplating when it is possible to supply a current from the first wiring layer 11. When a soldering material is used, the first wiring layer 11 and the second wiring layer 13 can be bonded together by performing heat treatment as appropriate at a temperature which melts the soldering material.

After the conductor 15 is formed, the second wiring layer 13 may be formed, for example, by a subtractive method, a semi-additive method, a full additive method, or another method, as shown in FIG. 7B. The subtractive method is a method for obtaining the desired pattern by forming a resist in the desired pattern on a copper foil provided on a board, etching the excess foil, and then peeling off the resist. The semi-additive method is a method for obtaining the desired wiring pattern by forming a power supply layer by electroless plating, sputtering, CVD, or another method, then forming a resist having the desired pattern, depositing metal in the open portion of the resist by an electroplating method, removing the resist, and etching the power supply layer. The full additive method is a method for obtaining the desired wiring pattern by causing an electroless plating catalyst to be adsorbed onto a board, then forming a pattern in a resist, activating the catalyst with the resist still remaining as an insulating film, and depositing metal in the open portion of the insulating film by electroless plating. A method may also be used in which a concave portion as the wiring pattern is provided to the insulating layer 12 separately from the via hole 14, and a power supply layer is formed by electroless plating, sputtering, CVD, or another method, after which the concave portion is filled by electroless plating or electroplating, and the surface is prepared by polishing.

In the second modification described above, since the via 16 is filled in the same manner as in the first modification, the danger of air bubbles becoming trapped in the concave portion as shown in FIG. 4C can be avoided, and the reliability of the micro-via is enhanced. It also becomes possible to form a separate via at the top of the via 16.

What is claimed is:

1. A wiring board for mounting a semiconductor element or an electronic component, said wiring board comprising:
   a plurality of wiring layers;
   one or a plurality of insulating layers provided between said wiring layers; and
   vias provided to said insulating layer and electrically connect the upper and lower wiring layers of said insulating layer which is provided with said vias; wherein
   at least one of said vias is designed so that the cross-sectional shape of the via in the plane parallel to said wiring layers is obtained by the partial overlapping of a plurality of similar shapes and the at least one of said vias does not overlie any vias provided to the one or the plurality of insulating layers, in the plane parallel to said wiring layers,
   the similar shapes are one of convex polygons, convex polygons with at least one curved vertex, or rounded shapes with no straight edges,
   the partial overlapping does not include a center point of any of the plurality of similar shapes, and
   the cross-sectional shape of said at least one of said vias is narrowest across said overlapping portion.

2. The wiring board according to claim 1, wherein
   all of said vias are designed so that the cross-sectional shape of the vias in the plane parallel to said wiring layers is obtained by the partial overlapping of a plurality of similar shapes.

3. The wiring board according to claim 1, wherein
   said wiring board has power wiring; and
   said vias whose cross-sectional shape in the plane parallel to said wiring layers is obtained by the partial overlapping of a plurality of similar shapes are electrically connected to said power wiring.

4. The wiring board according to claim 1, wherein said wiring board comprises ground wiring; and
   said vias whose cross-sectional shape in the plane parallel to said wiring layers is obtained by the partial overlapping of a plurality of similar shapes are electrically connected to said ground wiring.

5. The wiring board according to claim 1, wherein
   said wiring board has both power wiring and ground wiring;
   the vias that are electrically connected to said power wiring are designed so that the cross-sectional shape of the vias in the plane parallel to said wiring layers is obtained by the partial overlapping of a plurality of similar shapes; and
   the vias that are electrically connected to said ground wiring are designed so that the cross-sectional shape of the vias in the plane parallel to said wiring layers is obtained by the partial overlapping of a plurality of similar shapes.

6. The wiring board according to claim 1, wherein
   said wiring board has signal wiring; and said vias whose cross-sectional shape in the plane parallel to said wiring layers is obtained by the partial overlapping of a plurality of similar shapes are electrically connected to said signal wiring.

7. The wiring board according to claim 1, comprising a via end that is disposed further outside than the via end that is closest to the center point of a next adjacent via shape.

8. The wiring board according to claim 1, wherein said similar shapes are circles.

9. The wiring board according to claim 1, wherein each of said vias comprises a via hole provided to said insulating layer; and a conductor which is provided inside said via hole and which electrically connects said wiring layers provided so as to sandwich said insulating layer.

10. The wiring board according to claim 9, wherein the primary material constituting said conductor is at least one type of material selected from the group consisting of copper, aluminum, gold, silver, nickel, a soldering material, and a conductive paste.

11. The wiring board according to claim 9, wherein said conductor inside said via hole is formed so as to cover the inner wall of said via hole.

12. The wiring board according to claim 9, wherein said conductor inside said via hole is formed so as to fill the inside of said via hole.

13. The wiring board according to claim 1, wherein at least a part of said upper wiring layer is formed directly on said lower wiring layer.

14. The wiring board according to claim 1, wherein at least a part of said upper wiring layer is in physical contact with said lower wiring layer.

15. The wiring board according to claim 1, wherein at least a part of said upper wiring layer is formed directly on said lower wiring layer, and said at least a part of said upper wiring layer is a conductor.

16. The wiring board according to claim 1, wherein at least a part of said upper wiring layer is a conductor which is provided inside said via, said conductor is in a plane parallel to said lower wiring layer, and said conductor electrically connects said wiring layers.

17. The wiring board according to claim 1, wherein said similar shapes are one of octagons, hexagons, quadrilaterals, rhombuses, trapezoids, and triangles.

18. The wiring board according to claim 17, wherein a plurality of center points of said plurality of similar shapes do not overlap and a center point of a shape comprising an overlapping portion of said plurality of similar shapes exists within any of said plurality of similar shapes.

19. The wiring board according to claim 18, wherein said shape comprising said overlapping portion of said plurality of similar shapes has corners.

20. The wiring board according to claim 1, wherein said cross-sectional shape of said via has corners.

21. The wiring board according to claim 1, wherein
said wiring board comprises power wiring and signal wiring;
at least one of said vias that is electrically connected to said power wiring is designed so that the cross-sectional shape of the via in the plane parallel to said wiring layers is obtained by the partial overlapping of a plurality of similar shapes; and
at least one of said vias that is electrically connected to said signal wiring is designed so that the cross-sectional shape of the via in the plane parallel to said wiring layers is a single shape not obtained by overlapping a plurality of similar shapes.

22. The wiring board according to claim 1, wherein
said wiring board comprises ground wiring and signal wiring;
at least one of said vias that is electrically connected to said ground wiring is designed so that the cross-sectional shape of the via in the plane parallel to said wiring layers is obtained by the partial overlapping of a plurality of similar shapes; and
at least one of said vias that is electrically connected to said signal wiring is designed so that the cross-sectional shape of the via in the plane parallel to said wiring layers is a single shape not obtained by overlapping a plurality of similar shapes.

23. A wiring board for mounting a semiconductor element or an electronic component, said wiring board comprising:
a plurality of wiring layers;
a plurality of insulating layers, each insulating layer provided between two of said wiring layers; and
vias provided to said plurality of insulating layers, each via electrically connecting at least two of said wiring layers; wherein
at least one of said vias has a cross-sectional shape, in a plane parallel to said wiring layers, which is obtained by the partial overlapping of a plurality of similar shapes, and said via does not extend through all of said plurality of insulating layers, and said via does not overlie any vias provided to the plurality of layers, in the plane parallel to said wiring layers,
the partial overlapping does not include a center point of any of the plurality of similar shapes, and
the cross-sectional shape of said at least one of said vias is narrowest across said overlapping portion.

* * * * *